(12) United States Patent
Shim et al.

(10) Patent No.: US 11,840,458 B2
(45) Date of Patent: Dec. 12, 2023

(54) LAYERED GAN AND GAN NANOSHEET, AND ELECTRICAL DEVICE USING THE SAME

(71) Applicant: Industry-Academic Cooperation Foundation, Yonsei University, Seoul (KR)

(72) Inventors: Woo-young Shim, Seoul (KR); Jong-bum Won, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 17/111,087

(22) Filed: Dec. 3, 2020

(65) Prior Publication Data
US 2022/0073364 A1 Mar. 10, 2022

(30) Foreign Application Priority Data
Sep. 9, 2020 (KR) ........................ 10-2020-0115372

(51) Int. Cl.
| | | |
|---|---|---|
| *C01G 15/00* | (2006.01) | |
| *H01L 29/06* | (2006.01) | |
| *H01L 29/20* | (2006.01) | |
| *B82Y 30/00* | (2011.01) | |
| *B82Y 40/00* | (2011.01) | |

(52) U.S. Cl.
CPC ........ *C01G 15/006* (2013.01); *H01L 29/0665* (2013.01); *H01L 29/2003* (2013.01); *B82Y 30/00* (2013.01); *B82Y 40/00* (2013.01); *C01P 2004/24* (2013.01)

(58) Field of Classification Search
CPC ...... B82Y 30/00; B82Y 40/00; C01G 15/006; C01P 2004/24; H01L 29/0665; H01L 29/2003
See application file for complete search history.

(56) References Cited

U.S. PATENT DOCUMENTS 5,633,192 A * 5/1997 Moustakas .......... H01L 21/0237
438/46

OTHER PUBLICATIONS

Kang et al, "Effects of Hydro. and Anneal. on the Deep Levels in GaN Epilayers Grown on Sapphire Substrates," Jan. 15, 2000, Japan Journal of App. Physics, vol. 39, pp. L25-L27 (Year: 2000).*
Liu et al, "Electronic properties and atomic structure of Mg-doped multilayer g-GaN base on first-principles," Oct. 26, 2020, Elsevier (Applied Surface Science), Issue 539, pp. 1-7 (Year: 2020).*
Baodan Liu et al., "Template Approach to Crystalline GaN Nanosheets", Nano Letter, Apr. 2017.
G. Wang et al., "Growth of GaN single crystals by Ca3N2 flux", Elsevier, Sep. 22, 2007.

* cited by examiner

*Primary Examiner* — Maria V Ewald
*Assistant Examiner* — Ethan Weydemeyer
(74) *Attorney, Agent, or Firm* — Bridgeway IP Law Group, PLLC; Jihun Kim

(57) ABSTRACT

Proposed are a layered GaN compound, a nanosheet that may be prepared using the same, and an electrical device including the materials. Proposed is a layered compound represented by $M_{1-x}Ga_yN_z$ (M is at least one of Group II elements, and $0<x\leq1.0$, $0.6\leq y\leq1.25$, $0.75\leq z\leq1.5$).

16 Claims, 14 Drawing Sheets

LAYERED GAN AND GAN NANOSHEET, AND ELECTRICAL DEVICE USING THE SAME

BACKGROUND OF THE INVENTION

1. Field of the Invention

The present invention relates to GaN having a layered structure and a GaN nanosheet, and an electrical device using the same, and more particularly, to GaN having a layered structure and a GaN nanosheet, which contain some alkaline earth metal and have various electrical properties, and an electrical device using the same.

2. Description of the Related Art

Layered compounds connected to interlayers through van der Waals bonds may show various properties, and the layered compounds may be delaminated through physical or chemical methods to prepare two-dimensional (2D) nanosheets having a thickness of several to hundreds of nanometers, and thus, active research into the layered compounds is underway.

In particular, low-dimensional materials such as nanosheets are expected to have innovative new functions that existing bulk materials fail to provide, and are highly likely to serve as next-generation future materials instead of the existing materials.

However, up until now, the layered compounds having a two-dimensional crystal structure are limited to materials such as graphite, transition metals, and chalcogen compounds to hardly develop into materials of various compositions.

Meanwhile, gallium nitride is widely used in optoelectronic devices such as LEDs or high-frequency and high-power devices as a wide band gap material having an energy band gap of 3.4 eV but up until now, GaN having a layered structure is not specifically known.

GaN compounds having a layered structure, unlike existing GaN compounds having a different crystal structure, are expected to allow diversified application, and to be applicable to new areas that have not been reached before.

SUMMARY OF THE INVENTION

According to an embodiment of the invention, there are provided a layered GaN compound, a nanosheet that may be prepared using the same, and an electrical device including the materials.

According to an embodiment of the invention, there is provided a layered compound represented by $M_{1-x}Ga_yN_z$ (M is at least one of Group II elements, and $0<x\leq1.0$, $0.6\leq y\leq1.25$, $0.75\leq z\leq1.5$).

According to an embodiment of the invention, there is provided a layered compound represented by $M_{1-x}H_aGa_yN_z$ (M is at least one of Group II elements, and $0<x\leq1.0$, $0<a\leq x$, $0.6\leq y\leq1.25$, $0.75\leq z\leq1.5$).

According to an embodiment of the invention, there is provided a nanosheet including a compound represented by $M_{1-x}Ga_yN_z$ (M is at least one of Group II elements, and $0<x\leq1.0$, $0.6\leq y\leq1.25$, $0.75\leq z\leq1.5$), and prepared through a physical or chemical peeling method.

According to an embodiment of the invention, there is provided a nanosheet including a compound represented by $M_{1-x}H_aGa_yN_z$ (M is at least one of Group II elements, and $0<x\leq1.0$, $0<a\leq x$, $0.6\leq y\leq1.25$, $0.75\leq z\leq1.5$), and prepared through a physical or chemical peeling method.

According to an embodiment of the invention, there is provided an electrical device including the layered compound or nanosheet as described above.

In addition, the electrical device may be a memristor.

A layered GaN compound and a GaN nanosheet that may be provided through an embodiment of the invention may have various electrical properties, thereby enabling the development of new electrical devices.

DETAILED DESCRIPTION OF THE EXEMPLARY EMBODIMENTS

Hereinafter, configuration and operation of embodiments of the invention will be described with reference to the accompanying drawings. In the following description, when it is determined that the specific description of the known related art unnecessarily obscures the gist of the invention, the detailed description thereof will be omitted. In addition, when an element "includes" a component, it may indicate that the element does not exclude another component unless explicitly described to the contrary, but can further include another component.

The layered compound or nanosheet according to an embodiment of the invention may be represented by Formula 1 below.

$$M_{1-x}Ga_yN_z \quad \text{[Formula 1]}$$

(M is at least one of Group II elements, and $0<x\le1.0$, $0.6\le y\le1.25$, and $0.75\le z\le1.5$)

In general, GaN has a tetragonal structure, which is incapable of having a layered structure, and accordingly, peeling off GaN to prepare a nanosheet was hardly achievable.

In order to overcome the limitation, inventors of the invention have added Group II elements (hereinafter, referred to as an "additive element") to $Ga_yN_z$ to place the additive elements between $Ga_yN_z$ layers so as to prepare a layered compound in which the $Ga_yN_z$ layers are connected. The additive elements located between the $Ga_yN_z$ layers provide a weak bond between the $Ga_yN_z$ layers, and thus a plane on which the additive elements are located forms a cleavage plane that is easily cleaved along the plane.

Accordingly, the layered compound according to an embodiment of the invention may be easily peeled off along the cleavage plane into $Ga_yN_z$ layers through either or both physical or chemical methods, and the peeling is more easily achieved with an increasing amount of the additive elements removed. Accordingly, a $Ga_yN_z$ nanosheet may be easily obtained from the layered compound, and in this case, the additive elements may partially remain in the $Ga_yN_z$ nanosheet.

With the continuous removal of the additive element, the distance between the $Ga_yN_z$ layers in the compound gradually becomes greater to weaken the interlayer bond, and eventually the bond between the layers breaks down, which may cause cracks between the layers. Therefore, the layered structure of the layered compound described in an embodiment of the invention includes a case where a repeating two-dimensional $Ga_yN$ layers are interlayer-bonded through van der Waals bonds by the additive elements, as well as a case where the bonding force between the $Ga_yN$ layers is removed to increase the interlayer distance, thereby forming cracks. As such, the additive elements are removed to weaken the interlayer bond, and accordingly, easier peeling to prepare a nanosheet may be achievable.

Figure 1:
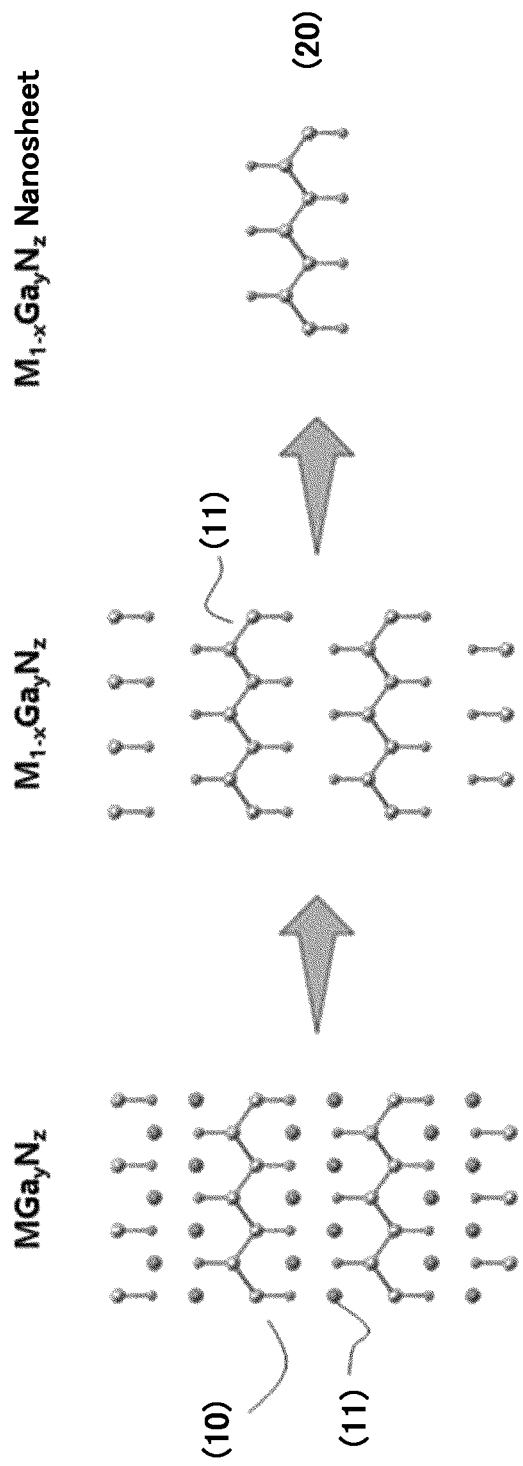
FIG. 1 is a conceptual view illustrating a layered compound according to an embodiment of the invention and a nanosheet prepared using the same.

A conceptual view of examples of the layered compound and nanosheet is shown in FIG. 1, which shows that an additive element, M 11 is positioned between $Ga_yN_z$ layers 10 of $MGa_yN_z$ to keep the bond between the $Ga_yN_z$ layers 10, and in this case, the removal of the M 11 weakens the bond between the $Ga_yN_z$ layers 10 or increases the interlayer distance, thereby forming cracks in $MGa_yN_z$, and thus the compound is peeled off to prepare a $M_{1-x}Ga_yN_z$ nanosheet 20. In this case, the additive elements may partially remain in the $Ga_yN_z$ nanosheet.

The nanosheet prepared through the peeling from the layered compound may be a single layer of $Ga_yN_z$, but may be formed when a plurality of layers overlaps so as to be several hundreds of nm thick. In general, nanosheets may exhibit anisotropy according to a two-dimensional shape only when a thickness to a lateral width is less than a certain level. To this end, the ratio of a thickness (d) to a width (L) of a nanosheet (d/L) is preferably 0.1 or less. A width of the nanosheet prepared through an embodiment of the invention may be 5 μm or greater, and thus, a thickness of the nanosheet is preferably 500 nm or less. In this case, the additive elements may partially remain in the $Ga_yN_z$ nanosheet.

As such, the nanosheet according to an embodiment of the invention refers to a sheet peeled off from a layered compound through a physical or chemical method, and includes being formed as a plurality of $Ga_yN_z$ layers in addition to being formed as a single $Ga_yN_z$ layer.

The additive elements may be Ca, which is a Group II element, and a layered compound that may be obtained by adding Ca may be $Ca_3(GaN_2)_2N$. $Ca_3(GaN_2)_2N$ may have a space group of C2/c and CaGaN may have a space group of P4/nmm.

However, apart from Ca, in theory, Be, Mg, Sr, Ba, which are Group II elements, may serve as additive elements as well. The $M_{1-x}Ga_yN_z$ layered compound or nanosheet that may be obtained from the possible layered $MGa_yN_z$ compound is also included in the scope of an embodiment of the invention.

A layered compound and a nanosheet using the layered compound may be obtained without completely removing the additive elements from the layered compound and the residual additive elements may allow the layered compound and the nanosheet to exhibit various electrical properties.

In the residual additive elements, x may be in the range of $0.1\le x\le1.0$, and preferably in the range of $0.25\le x\le1.0$ according to Formula 1 described above.

When an additive element, M is partially removed from the $MGa_yN_z$ compound, the bonding force between the $Ga_yN_z$ layers is weakened, and the $Ga_yN_z$ layers may thus be easily peeled off. Therefore, it is preferable to remove a certain amount or more of the additive elements, and the range of x in the layered compound or nanosheet of Formula $M_{1-x}Ga_yN_z$ according to an embodiment of the invention may be $0.1\le x\le1.0$, and more preferably $0.25\le x\le1.0$. In addition, the additive elements may remain in a very small amount in the range of $0.99\le x\le1.0$ to enable easy peeling and having similar properties to existing GaN as well.

Further, the layered compound or nanosheet in which M is partially removed may exhibit various electrical properties through the residual additional elements. Therefore, it may be desirable to partially remove the additive elements from the layered compound or nanosheet and keep the rest some. x for this may have a range of $0.25\le x\le0.8$.

A strong acid such as nitric acid or hydrochloric acid may be used for the removal of additive elements, and as the additive elements are removed through the strong acid, the place where the additive elements are removed is replaced with hydrogen ions included in the strong acid which is then bonded thereto, and thus a layered compound containing hydrogen and a nanosheet prepared using the compound may be provided.

The layered compound containing hydrogen or the nanosheet therefrom may be represented by Formula 2 below.

$$M_{1-x}H_aGa_yN_z \quad \text{[Formula 2]}$$

(M is at least one of Group II elements, and $0<x\le1.0$, $0.6\le y\le1.25$, and $0.75\le z\le1.5$).

In this case, hydrogen ions replace the additive elements, and are added in less than the amount of additive elements removed.

The range of x, an amount by which the additive elements are removed, may be $0.1\le x\le1.0$, and preferably may be $0.25\le x\le0.8$. As described above, in order to decrease the interlayer bonding force, it is required to remove the additive elements at a certain ratio or greater, and the additive element M remaining between the layers allows various electrical characteristics.

In addition, the additive elements may remain in a very small amount in the range of 0.99≤x≤1.0 to enable easy peeling into a nanosheet and having similar properties to GaN as well.

In addition, a above may have the same value as x, and hydrogen ions may replace the removed additive elements to be included in the layered compound.

The layered compound or nanosheet described above exhibits various properties as a result of analysis, and these analysis results will be described below. The layered compound and the nanosheet described here include both cases of with/without additional elements.

In XRD measurement using CuKα rays, the layered compound or nanosheet according to an embodiment of the invention may have peaks at the positions of 2θ=11.7°±0.50°, 34.5°±0.50°, 35.5°±0.50°, 43.9°±0.50°, and 51.1°±0.50°. In the present specification, in XRD measurement, the peaks may have an intensity of 3% or greater with respect to a peak having the greatest intensity in the graph provided through the XRD measurement.

In addition, in XRD measurement using CuKα rays, the layered compound and the nanosheet have a $I_{(110)}/I_{(001)}$ value of 2.0 or less which is a peak intensity of a (110) plane at the position of 2θ=35.5°±0.50° to a peak intensity of a (001) plane at the position of 2θ=11.7°±0.50°.

With no removal of the additive elements, the peaks on the (110) plane are strong, but with the removal of the additive elements, the peaks on the (110) plane decreases and the peaks on the (001) plane become stronger.

When hydrogen ions are removed when the additive elements are removed, a bond between nitrogen and hydrogen is formed, and accordingly, peaks according to the bond are shown in Fourier-transform infrared spectroscopy (FT-IR) analysis. Therefore, the layered compound and nanosheet containing hydrogen ions exhibit peaks according to the N—H bonding in the range of 1,400 cm-1 to 1,500 cm-1 through FT-IR analysis.

In addition, the presence of the hydrogen is also shown in X-ray photoelectron spectroscopy (XPS) analysis, and in the range of 1,140 eV to 1,155 eV and 1,115 eV to 1,125 eV according to the binding energy of Ga (2P), two binding peaks (XPS peak shoulder) are shown. On the other hand, the layered compound and the nanosheet without hydrogen each exhibit only one bonding peak in the above energy range.

The layered compound and the nanosheet as described above may exhibit various electrical properties due to a unique layered structure and residual additional elements.

First, the layered compound and the nanosheet according to an embodiment of the invention exhibit ferroelectric-like properties.

Ferroelectric properties are generally found in oxides of an asymmetric structure such as $BaTiO_3$ of a perovskite structure, and are found according to changes in the position of Ba located at the cent.

However, the layered compound and the nanosheet according to an embodiment of the invention does not have the asymmetric structure, but nevertheless exhibit ferroelectric properties. Despite the fact that the layered compound or nanosheet does not have the asymmetric structure, the layered compound or nanosheet still exhibits ferroelectric-like properties since the position of the residual additive elements moves according to an external electric field.

In addition, the layered compound and the nanosheet according to an embodiment of the invention exhibit resistance switching properties.

When a material has resistance switching properties, current does not increase linearly according to voltages applied to the material, but when an initial voltage is applied, the material keeps a high resistance state to have an insignificant increase in the current and then when the material reaches a certain critical point, the material switches to a low resistance state to have a sharp increase in the current.

These resistance switching properties are generally found in oxides, and recently, using these properties, memory devices such as a memristor capable of storing information like a flash memory have been actively developed, and, through the resistance switching properties, the layered compound and the nanosheet of an embodiment of the invention may be actively used in the development of memory devices such as the memristor.

In addition, the layered compound and the nanosheet according to an embodiment of the invention may exhibit various energy band gaps.

It is known that the energy band gap of general GaN is 3.4 eV, but according to an embodiment of the invention, the layered compound and the nanosheet from which the additional elements are partially removed show semiconductor characteristics having an energy band gap in the lower range of 0.1 eV to 2.5 eV, or in the range of 1.3 eV to 2.2 eV.

In particular, this energy band gap may be controlled according to the amount of additive elements removed, and the greater the amount of residual additive elements are, the smaller the size of the energy band gap is, and the smaller the amount of residual additive elements are, the greater the size of the energy band gap is. The energy band gap of the semiconductor material may be controlled through the adjustment of the amount of the additive elements.

Through the variable energy band gaps, the layered compound and the nanosheet exhibit various luminescence properties in PL (photoluminescence) measurement, unlike general GaN.

A layered compound and a nanosheet that the invention provides may have various electrical properties, thereby enabling the application to various electrical devices. In particular, the layered compound and the nanosheet may be applicable as a memristor element, which is being actively developed as a neuromorphic memory element.

Example

1) Synthesis of CaGaN Having a Layered Structure

Ga and $Ca_3N_2$ were weighed at a molar ratio of Ga:$Ca_3N_2$=1:4, put into a tungsten tube, sealed, and then placed in a quartz tube to create a vacuum atmosphere at a level of 0.1333 Pa. Thereafter, while nitrogen gas was injected in an amount of 5 L/min, the resultant was put at a temperature raised by 50° C. per hour, heated to 900° C., and kept at the temperature for 24 hours.

Subsequently, the resultant was subjected to cooling at a rate of 0.1° C. per hour to room temperature, and the collected sample was washed with a HCl solution and deionized water to remove residual $Ca_3N_2$ and separate black crystal therefrom to synthesize a final CaGaN compound. All processes described above were performed in a glove box under argon atmosphere.

2) Removal of Ca Ions

Removal using nitric acid: 15 ml (3.5 M) of nitric acid was mixed with 0.1 g CaGaN and the mixture was subjected to reaction at room temperature and pressure.

The reaction time was varied to 10 minutes, 15 minutes, 20 minutes, 30 minutes, and 60 minutes to prepare samples. After the reaction in nitric acid, the resultant was additionally washed with deionized water to remove the formed $Ca(NO_3)_2$.

Removal using iodine: iodine and acetonitrile solvent were mixed to prepare a 12 ml (0.025 M) solution, which was then subjected to reaction with 0.1 g of CaGaN powder at room temperature and pressure for 24 hours. After the reaction was complete, the resultant was washed with an acetonitrile solvent to remove the formed $CaI_2$ salt.

Accordingly, the samples from which additive elements were removed through nitric acid and iodine were obtained as shown in the table below. Sample G was a layered CaGaN without a process of the removal of Ca.

TABLE 1

| Name of sample | Removal of additive elements | Reaction time | Residual Ca (at %) |
|---|---|---|---|
| Sample A | Nitric acid | 10 minutes | — |
| Sample B | Nitric acid | 15 minutes | — |
| Sample C | Nitric acid | 20 minutes | — |
| Sample D | Nitric acid | 30 minutes | 11.4 |
| Sample E | Nitric acid | 60 minutes | — |
| Sample F | Iodine | 24 hours | — |
| Sample G | — | — | (Before the removal of Ca) |

3) Process of Preparing Nanosheets

Nanosheets were prepared through a tape peeling method for the samples prepared as shown in Table 1 above.

Results of analyzing the layered compound and the nanosheet obtained through the examples described above will be described in detail below.

Figure 2:
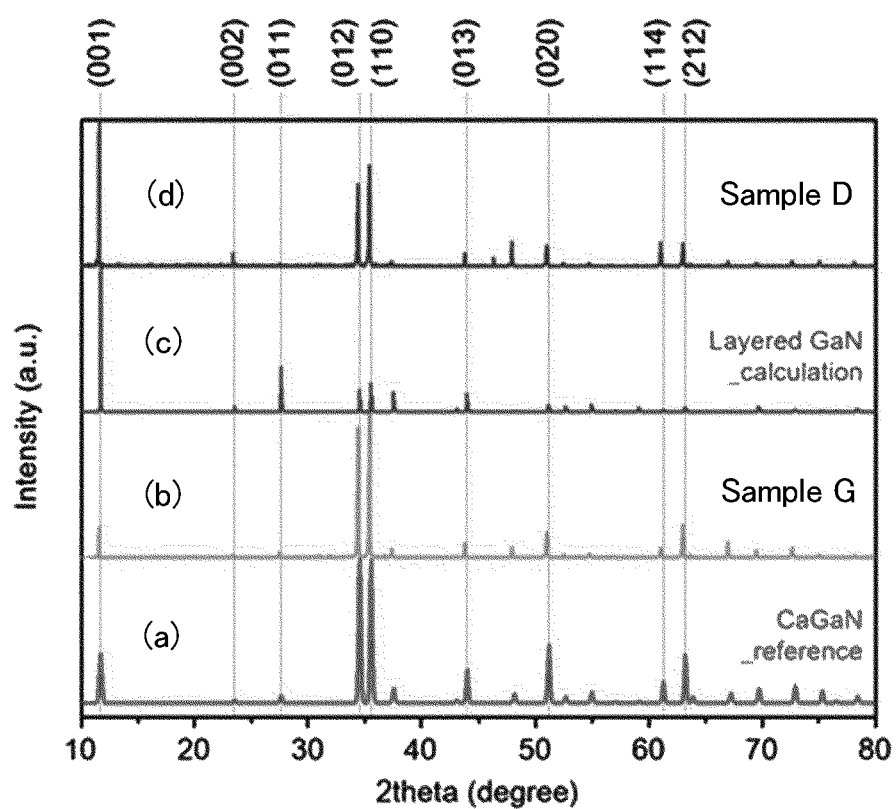
FIG. 2 is a graph illustrating results of XRD diffraction patterns of samples according to an embodiment of the invention.

First, results of XRD measurement are shown in FIG. 2. FIG. 2(a) shows peaks according to a reference data value of CaGaN, FIG. 2(b) shows measurement peaks for Sample G, which is the layered CaGaN, FIG. 2(c) shows peaks according to calculation for the layered structure GaN, and FIG. 2(d) shows measurement peaks for Sample D, which is a layered compound.

Sample G, which is CaGaN before Ca was removed, exhibited peaks well consistent with the reference data values (FIGS. 2(a) and 2(b)). It was observed that Sample D, a layered compound subjected to the process of removing Ca, also showed peaks at the same location when XRD was measured, indicating that the structure was kept as the location of the main peaks stayed the same despite the removal of Ca.

In addition, it was found that with the removal of Ca, the peaks on the (110) plane, which were the strongest peaks before the removal, decreased and the peaks on the (001) plane became stronger. This was consistent with a trend through calculation (FIG. 2(c)). In Sample D, the value of $I_{(110)}/I_{(001)}$, which is the peak intensity of the (110) plane to the peak intensity of the (001) plane, was 0.68.

The results of FIG. 2 are equally observed in the nanosheet prepared from the layered compound.

Figure 3:
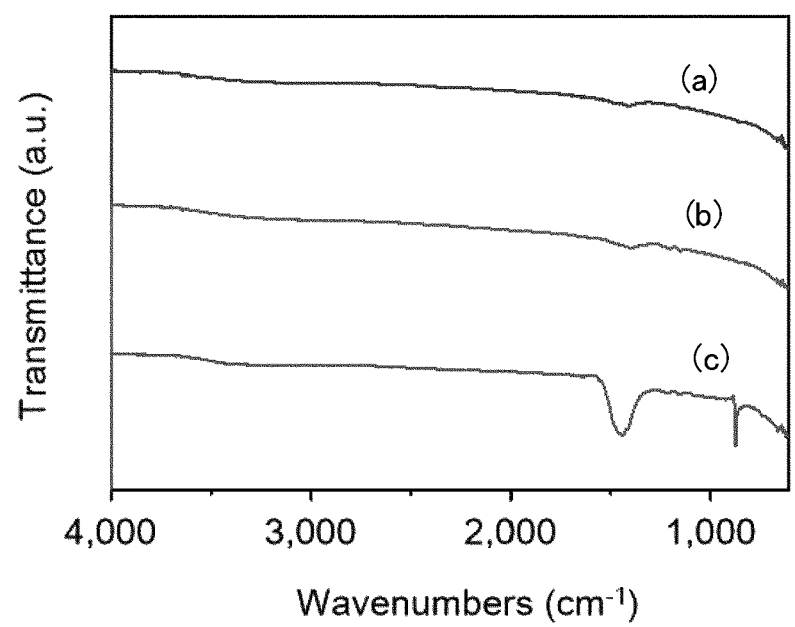
FIG. 3 is a graph illustrating results of Fourier-transform infrared spectroscopy (FT-IR) analysis of samples according to an embodiment of the invention.

FIG. 3 shows results of FT-IR analysis for the layered compound according to an embodiment of the invention, and the graph of FIG. 3(c) showing the results of FT-IR analysis of Sample D shows peaks according to N—H bonding at the position of 1,444 $cm^{-1}$ but FIG. 3(a), the graph of Sample G, a layered compound before the removal of the additive elements, and FIG. 3(b), the graph of Sample G without having hydrogen through the removal of additive elements using iodine show no peaks in the above wavelength range.

Figure 4:
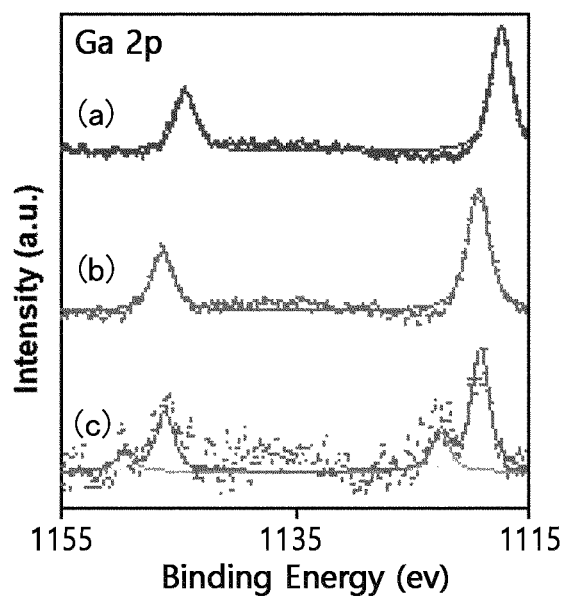
FIG. 4 is a graph illustrating results of X-ray photoelectron spectroscopy (XPS) analysis of samples according to an embodiment of the invention.

FIG. 4 shows results of XPS analysis. FIG. 4(a), the graph of XPS results of Sample G in which the additive element is not removed and does not contain hydrogen, shows one peak in each of the binding energy sections in the range of 1,140 eV to 1,155 eV and 1,115 eV to 1,125 eV. In FIG. 4(b), which is an XPS result graph of Sample F that does not contain hydrogen by removing the additive element through iodine, the binding energy section in which the peak appears slightly changed, but only one peak appears in the above ranges. However, the graph of FIG. 4(c) showing XPS results of Sample D having hydrogen ions through the removal of Ca in nitric acid for 30 minutes showed a small peak again at 1,149.5 eV next to a peak at 1,146.1 eV, and a small peak at 1122.6 eV next to a peak at 1119.3 eV. These peak shoulders indicate the presence of hydrogen.

The results of FIGS. 3 and 4 are equally observed in the nanosheets prepared from the layered compound.

Figure 5:
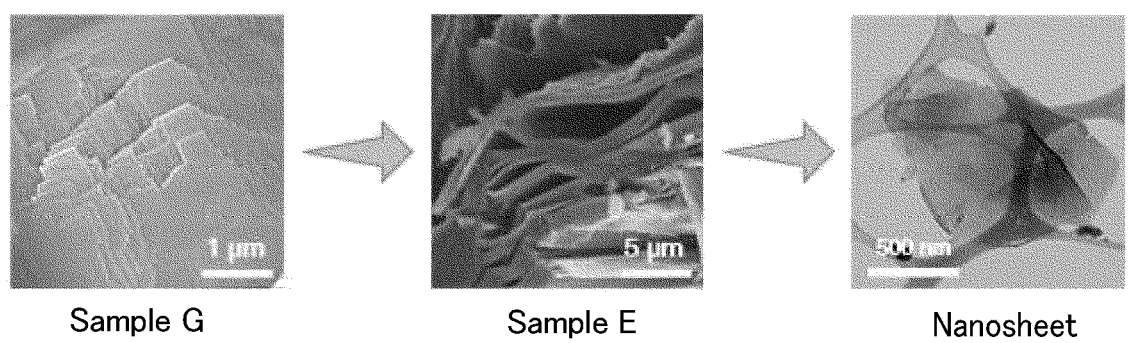
FIG. 5 is a scanning electron microscopy (SEM) image of samples according to an embodiment of the invention.

FIG. 5 shows scanning electron microscopy (SEM) images of the layered compound and the nanosheet by phase in the above embodiment. Sample G, a layered compound before the removal of Ca, shows a layered structure, but the layers are in close contact with each other through Van der Waals bonds. However, Sample E, in which Ca was removed for 60 minutes in nitric acid, shows cracks between the layers due to an increase in the gap between the layers, and shows a peeled nanosheet in the end. The layer between cracks may include a plurality of GaN layers. A trace amount of Ca may remain in sample E and the nanosheet in FIG. 5.

Figure 6:
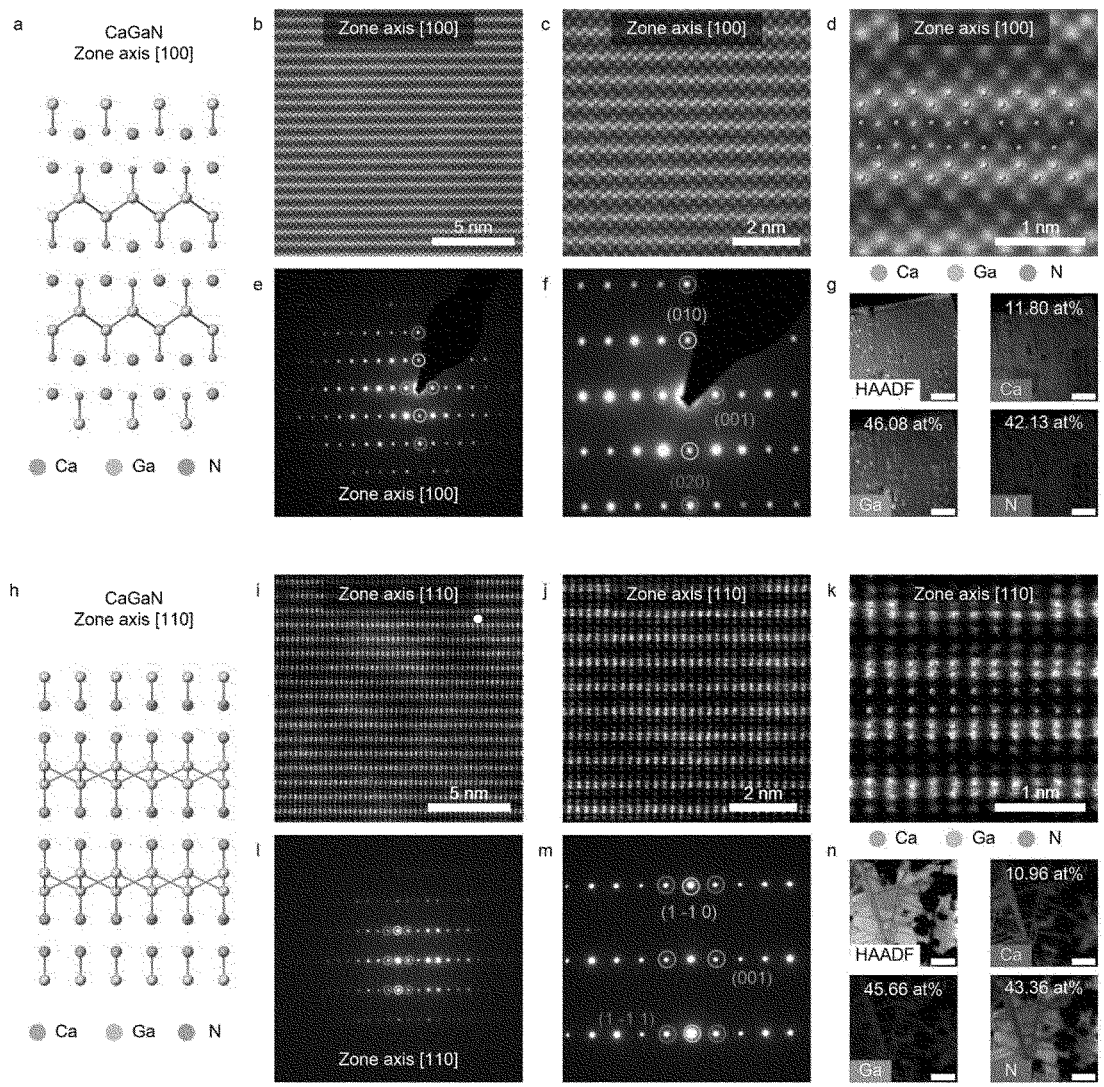
FIG. 6 is an image illustrating results of scanning transmission electron microscopy (STEM) and energy dispersive spectroscopy (EDS) analysis according to an embodiment of the invention.

FIG. 6 shows results of scanning transmission electron microscopy (STEM) analysis of Sample D which was subjected to reaction for 30 minutes in nitric acid to partially remove Ca. Analysis in [100] and [110] zone-axis was performed, and it was confirmed that the CaGaN structure forming a two-dimensional layer was well kept. Quantitative elemental composition ratios were confirmed through transmission electron microscopy-energy dispersive spectroscopy (TEM-EDS) mapping, and the analysis results showed that Ca was 11.8 at % and 10.96 at %, which were approximately the composition ratios of $Ca_{0.25}$ GaN.

Figure 7:
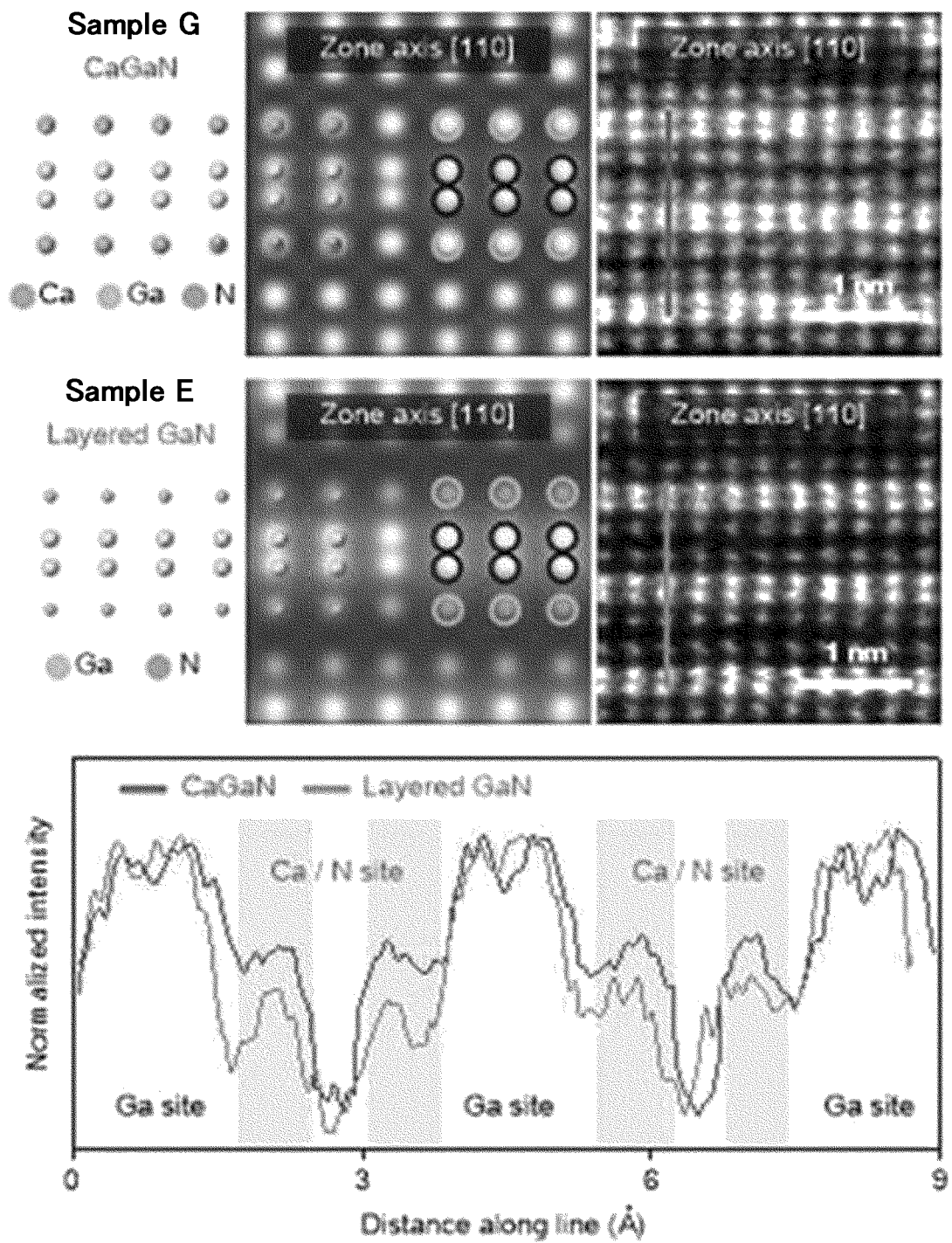
FIG. 7 is an image illustrating results of scanning transmission electron microscopy (STEM) and focused ion beam (FIB) analysis according to an embodiment of the invention.

Subsequently, the STEM analysis was performed on Sample E in which Ca was removed from nitric acid for 60 minutes through further removing Ca, and as shown in FIG. 7, a [110] zone-axis analysis and focused ion beam (FIB) analysis were performed in the cross-sectional direction. In the [110] plane subjected to STEM analysis, Ca and N were shown to overlap each other, and the image intensity at the positions of Ca and N is relatively weaker after Ca was removed compared to before Ca was removed. This may seem to be caused due to the removal of Ca, and the results are more clearly shown in the FIB analysis. From the FIB results, it is seen that the intensity was remarkably reduced at the position where Ca and N overlapped after Ca was removed compared to before Ca was removed. Therefore, it was found that Ca was effectively removed and the layered structure was still kept even after the removal. In this case, Ca was completely removed or some remained.

Figure 8:
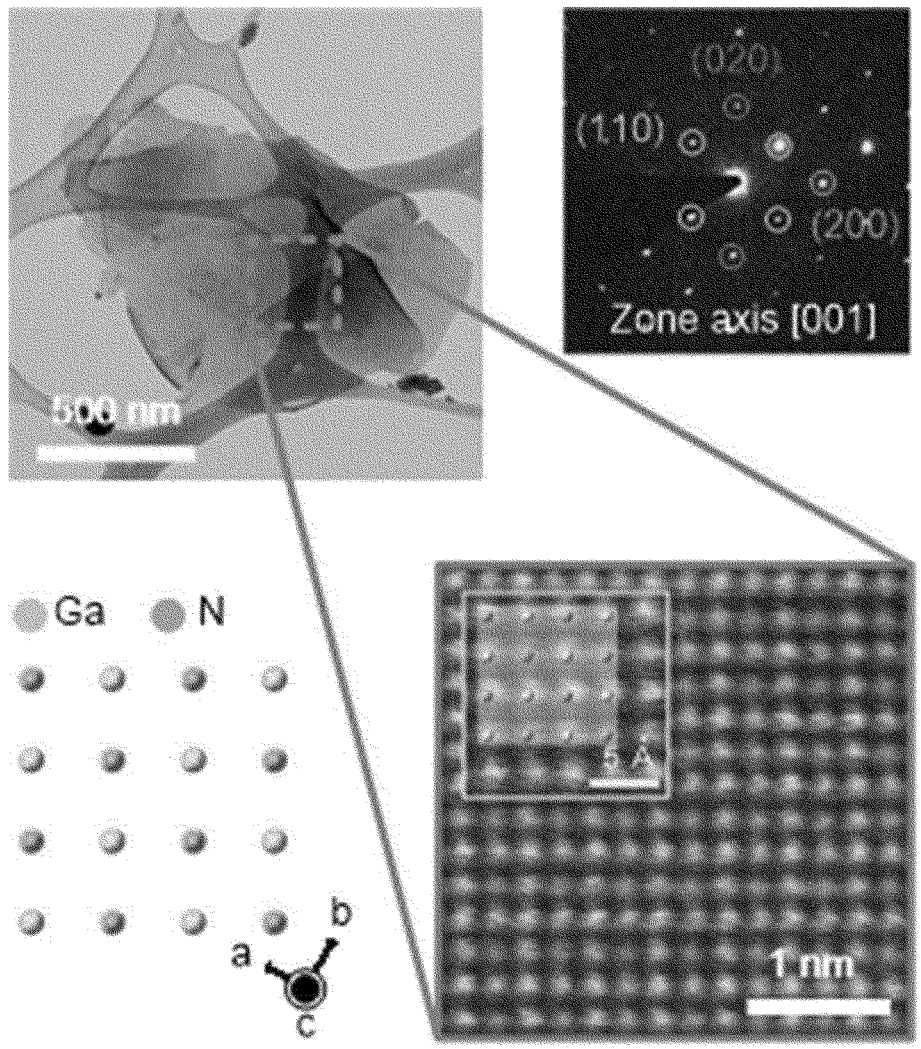
FIG. 8 is an image illustrating results of transmission electron microscope (TEM) analysis of samples according to an embodiment of the invention.

In this way, the crystallinity of the actual atomic structure was confirmed through STEM analysis of the nanosheet prepared by being peeling off from Sample E from which Ca was removed for 60 minutes in nitric acid. As shown in FIG. 8, it was confirmed that the crystallinity of the actual atomic structure had the same tetragonal structure as the layered compound before peeling through electron diffraction (ED) pattern analysis, and it was confirmed that the atomic structure was also the same as the layered compound before peeling. The nanosheet may also include some residual Ca.

Figure 9:
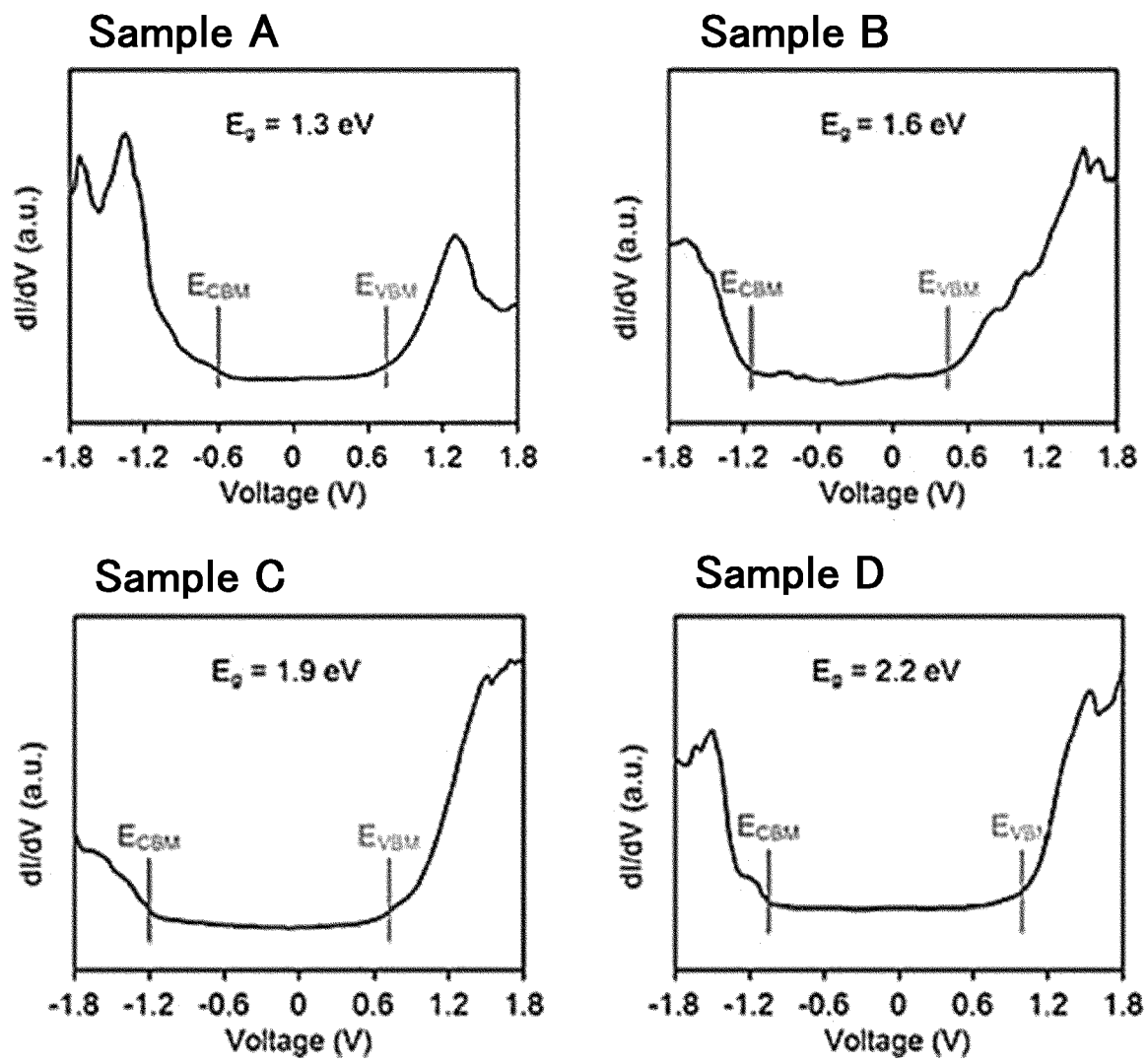
FIG. 9 is a graph illustrating results of scanning tunneling spectroscopy (STS) analysis of samples according to an embodiment of the invention.

Scanning tunneling spectroscopy (STS) analysis was performed to measure energy band gaps for the layered compound from which Ca was partially removed (see FIG. 9) To this end, a gold thin film was formed on a silicon substrate, and the nanosheets peeled off from Samples A to D were placed thereon. The layered structure was confirmed through scanning tunneling microscopy (STM) analysis, and the energy band gap showed 1.3 eV to 2.2 eV according to the amount of removed Ca through STS measurement, confirming that the layered structure was in the form of a semiconductor. The greater Ca was removed, the larger the energy band gap is.

Figure 10:
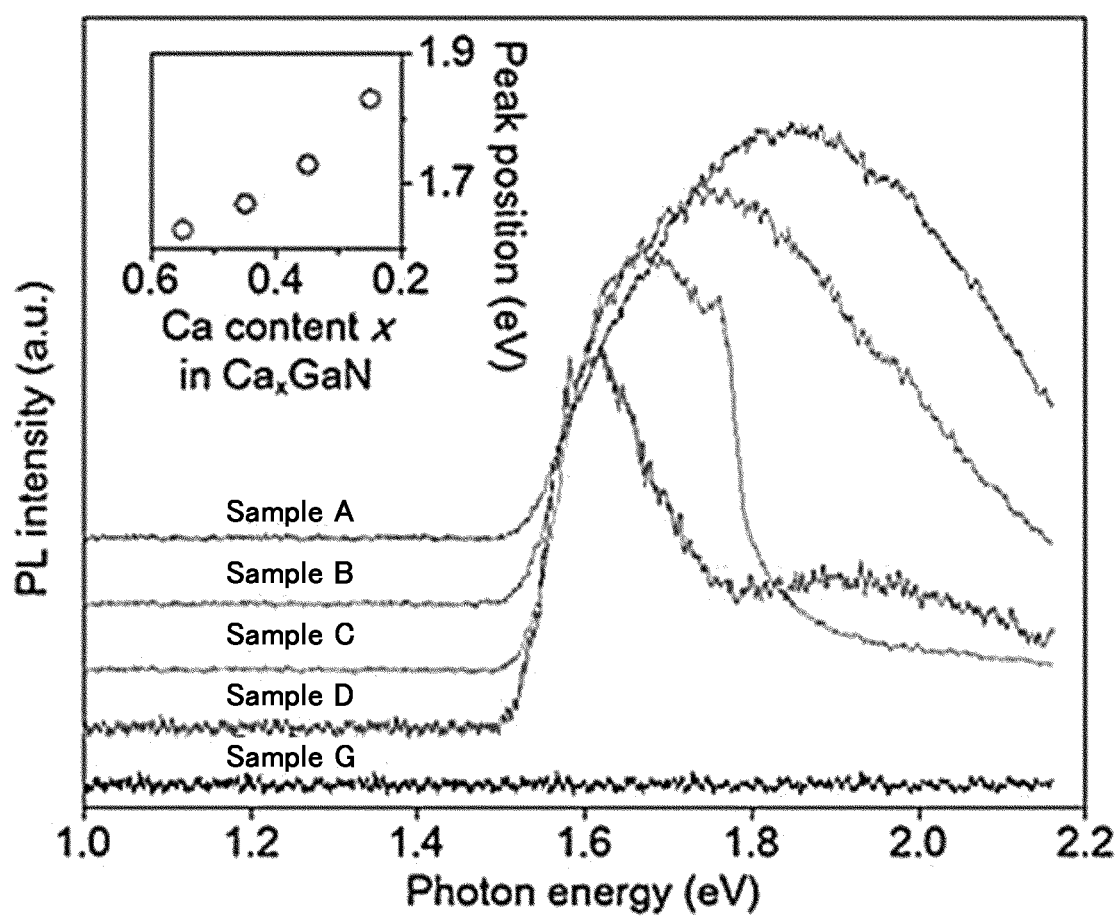
FIG. 10 is a graph illustrating photoluminescence properties in photoluminescence analysis of samples according to an embodiment of the invention.
Figure 11:
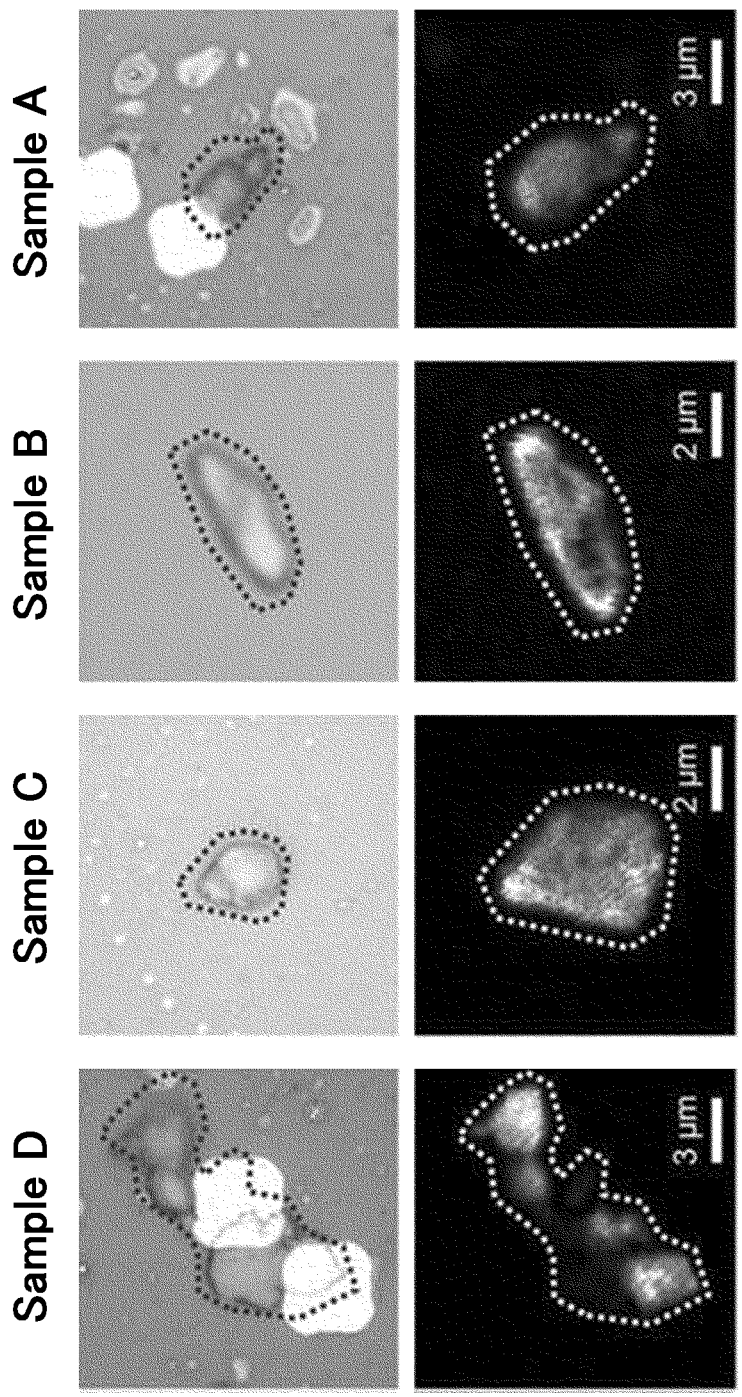
FIG. 11 is an image illustrating results of photoluminescence mapping analysis of samples according to an embodiment of the invention.

Unlike general GaN or CaGaN (Sample G) in which Ca is not removed, the nanosheets of Samples A to D have varied energy band gaps due to the amount of residual Ca, thereby exhibiting photoluminescence properties in photoluminescnece (PL) analysis. The results are shown in FIG. 10, and PL measurement of Samples A to D having various Ca composition ratios were performed. It was confirmed that the photon energy of PL increased with Ca greatly being removed, and this was found to be consistent with the results of the STS measurement in FIG. 9. In addition, through PL mapping in FIG. 11, it was confirmed that signals were expressed throughout the actual flake sample.

Figure 12:
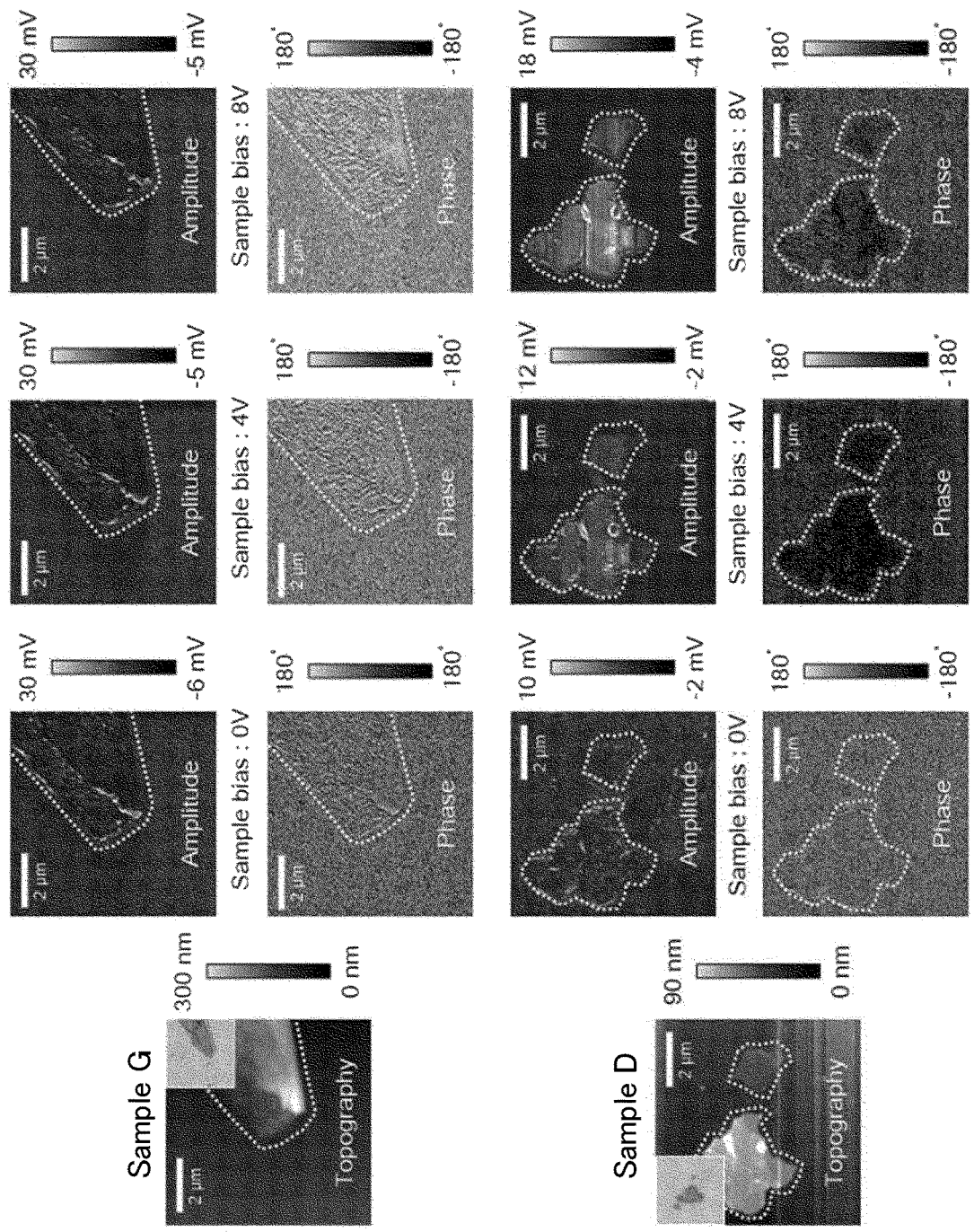
FIG. 12 is an image illustrating results of piezoelectric force microscopy (PFM) mapping of samples according to an embodiment of the invention.

Changes in piezoelectric properties were confirmed through piezoelectric force microscopy (PFM) analysis of CaGaN before Ca was removed and Sample D having a layered structure in which Ca was partially removed. FIG. 12 shows results of the PFM mapping analysis, and through the analysis, it is seen that a piezoelectric reaction was not observed in Sample G, a sample before the removal of Ca, but the piezoelectric reaction was clearly observed in Sample D from which Ca was removed.

Figure 13:
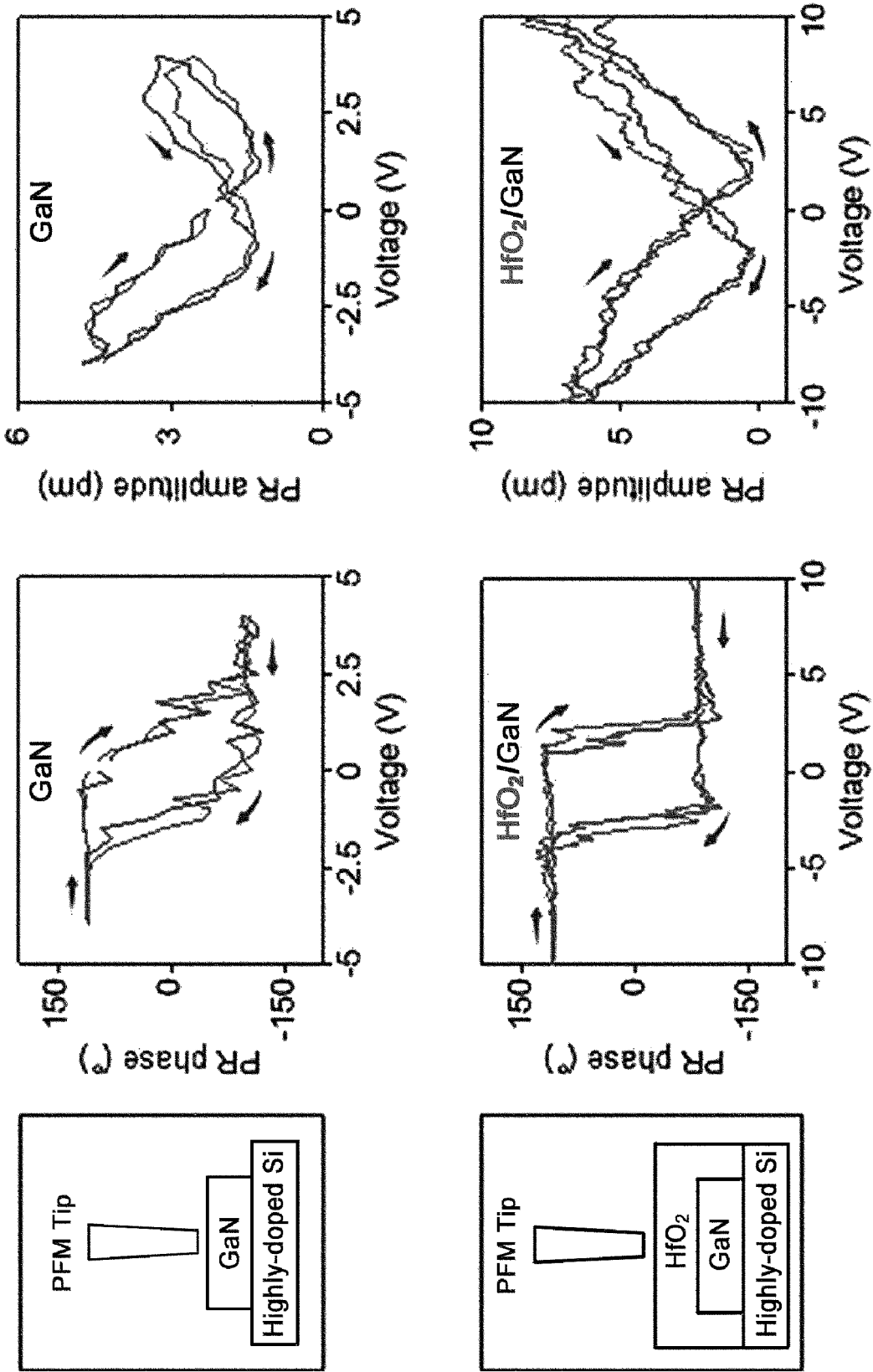
FIG. 13 is a graph illustrating results of measuring hysteresis curves of samples according to an embodiment of the invention.

In addition, hysteresis loop measurement was performed through PFM for the layered Sample D from which Ca was partially removed. The result showed a hysteresis loop according to the applied voltages as shown in FIG. 13.

Figure 14:
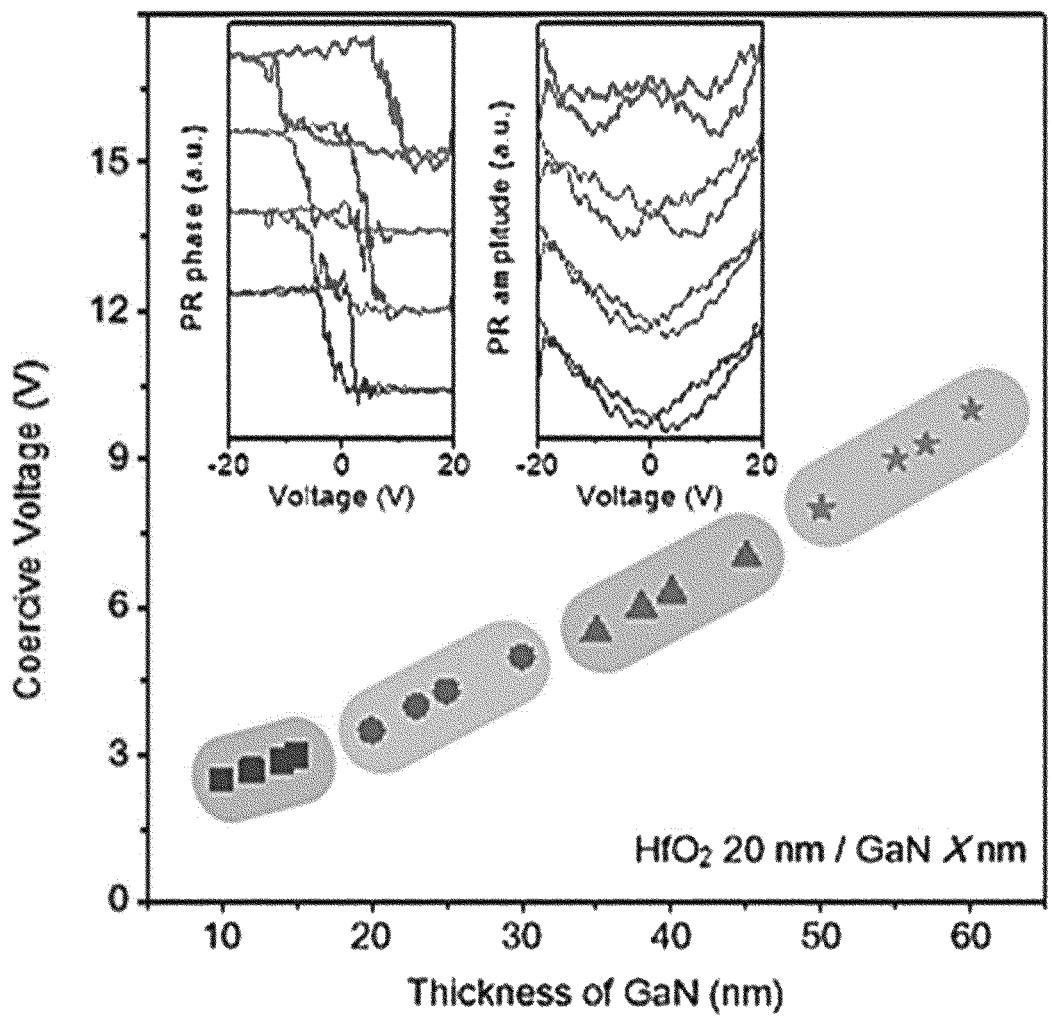
FIG. 14 is a graph illustrating results of measuring hysteresis curves and a coercive electric field according to a thickness of samples according to an embodiment of the invention.

In FIG. 14, changes in coercive voltage according to a thickness of the nanosheet peeled off from the layered Sample D were analyzed, and the results confirmed that hysteresis loop signals had a dependence on the thickness of the sample.

As such, results of measuring the piezoelectric properties and hysteresis loop in FIGS. 11 to 14 indicated that the layered $Ca_{1-x}GaN$ compound had ferroelectric properties.

Analysis was performed to find out whether resistance switching properties are exhibited using these ferroelectric-like properties. To this end, as shown in FIG. 15, a gold electrode was disposed on a silicon substrate and a nanosheet peeled off from Sample D was disposed therebetween, and resistance was measured while applying voltages to the electrode.

Figure 15:
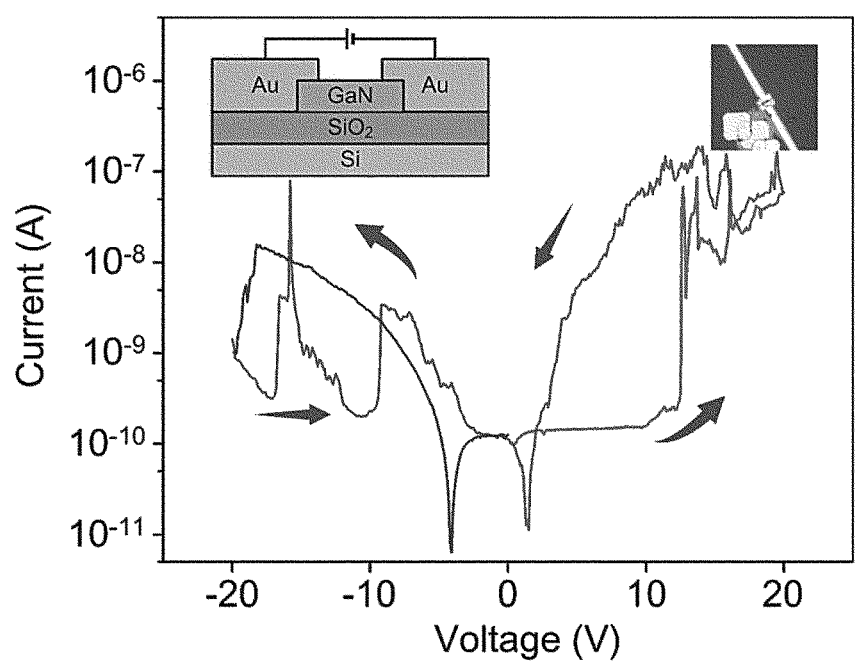
FIG. 15 is a graph of voltage-current properties of samples according to an embodiment of the invention.

As shown in FIG. 15, at an initial voltage, the layered $Ca_{1-x}GaN$ compound kept a high resistance state, showing a low current flow, but when the voltage is greater than a certain level, the layered $Ca_{1-x}GaN$ compound switched to a low resistance state, showing a sharp increase in the current. It is seen that the resistance state switched at the opposite voltage as well, indicating the resistance switching properties.

It was found that using the resistance switching properties, the nanosheet would be applied as a memristor device, which is being actively developed as a neuromorphic memory device.

What is claimed is:

1. A layered compound having a two-dimensional layered structure represented by Formula 1 below:

$$M_{1-x}Ga_yN_z \qquad \text{[Formula 1]}$$

(M is at least one of Group II elements, and 0.25≤x≤0.8, 0.6≤y≤1.25, and 0.75≤z≤1.5), wherein the M is positioned between $Ga_yN_z$ layers such that the $Ga_yN_z$ layers are interlayer-bonded by the M.

2. The layered compound according to claim 1, wherein the M is Ca.

3. The layered compound according to claim 1, wherein the layered compound is represented by Formula 2 below:

$$M_{1-x}H_aGa_yN_z \qquad \text{[Formula 2]}$$

(M is at least one of Group II elements, and 0.25≤x≤0.8, 0.6≤y≤1.25, 0<a≤x, and 0.75≤z≤1.5).

4. The layered compound according to claim 1, wherein, in XRD measurement using CuKα rays, the layered compound has a group of peaks at the positions of 2θ=11.7°±0.50°, 34.5°±0.50°, 35.5°±0.50°, 43.9°±0.50°, and 51.1°±0.50°, the peaks having an intensity of 3% or greater with respect to a peak from the group of peaks having the greatest intensity.

5. The layered compound according to claim 1, wherein, in XRD measurement using CuKα rays, the layered compound has a $I_{(110)}/I_{(001)}$ value of 2.0 or less which is a peak intensity of a (110) plane to a peak intensity of a (001) plane.

6. The layered compound according to claim 3, wherein the layered compound and a nanosheet comprising hydrogen ions exhibit peaks according to N—H bonding in a range of 1,400 cm$^{-1}$ to 1,500 cm$^{-1}$ through FT-IR analysis.

7. The layered compound according to claim 3, wherein, in X-ray photoelectron spectroscopy (XPS) analysis, the layered compound has two binding peaks (XPS peak shoulder) in a range of 1,140 eV to 1,155 eV and 1,115 eV to 1,125 eV according to a binding energy of Ga (2P).

8. The layered compound according to claim 1, wherein the layered compound exhibits resistance switching properties.

9. The layered compound according to claim 1, wherein the layered compound exhibits luminescence properties in photoluminescence analysis.

10. The layered compound according to claim 1, wherein the layered compound has an energy band gap of 0.1 eV to 2.5 eV.

11. A nanosheet comprising a compound having a two-dimensional layered structure represented by Formula 1 below, and prepared through a physical or chemical peeling method:

$$M_{1-x}Ga_yN_z \qquad \text{[Formula 1]}$$

(M is at least one of Group II elements, and 0.25≤x≤0.8, 0.6≤y≤1.25, and 0.75≤z≤1.5), wherein the M is positioned between $Ga_yN_z$ layers such that the $Ga_yN_z$ layers are interlayer-bonded by the M.

12. The nanosheet according to claim 11, wherein the compound exhibits resistance switching properties.

13. The nanosheet according to claim 11, wherein the compound exhibits luminescence properties in photoluminescence analysis.

14. The nanosheet according to claim 11,
wherein the compound has an energy band gap of 0.1 eV to 2.5 eV.

15. The nanosheet according to claim 11,
wherein the nanosheet has a thickness of 500 nm or less.

16. An electrical device comprising the layered compound according to claim 1.

* * * * *